(12) United States Patent
Fujii et al.

(10) Patent No.: US 11,081,637 B2
(45) Date of Patent: Aug. 3, 2021

(54) LAMINATE STRUCTURE, PIEZOELECTRIC ELEMENT, AND METHOD OF MANUFACTURING PIEZOELECTRIC ELEMENT

(71) Applicant: FUJIFILM Corporation, Tokyo (JP)

(72) Inventors: Takamichi Fujii, Kanagawa (JP); Takayuki Naono, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 837 days.

(21) Appl. No.: 15/846,258

(22) Filed: Dec. 19, 2017

(65) Prior Publication Data

US 2018/0123017 A1    May 3, 2018

Related U.S. Application Data

(63) Continuation of application No. PCT/JP2016/003037, filed on Jun. 23, 2016.

(30) Foreign Application Priority Data

Jun. 30, 2015  (JP) ............... JP2015-131539

(51) Int. Cl.
*H01L 41/187*  (2006.01)
*H01L 41/09*  (2006.01)
(Continued)

(52) U.S. Cl.
CPC ........ *H01L 41/187* (2013.01); *H01L 41/0805* (2013.01); *H01L 41/09* (2013.01);
(Continued)

(58) Field of Classification Search
CPC ... H01L 41/187; H01L 41/0805; H01L 41/09; H01L 41/094; H01L 41/0973; H01L 41/1876

(Continued)

(56) References Cited

U.S. PATENT DOCUMENTS

2006/0028095 A1  2/2006  Maruyama et al.
2010/0253749 A1*  10/2010  Arakawa ............... H01L 41/187
                                                              347/68

(Continued)

FOREIGN PATENT DOCUMENTS

EP       1 283 553 A2    2/2003
JP     2003-046154 A    2/2003
(Continued)

OTHER PUBLICATIONS

International Search Report; issued in PCT/JP2016/003037; dated Oct. 18, 2016.
(Continued)

*Primary Examiner* — Derek J Rosenau
(74) *Attorney, Agent, or Firm* — Studebaker & Brackett PC (57) ABSTRACT

A piezoelectric element is obtained using a method including: preparing a first structure; preparing a second structure; disposing a first facing electrode layer of the first structure to face a first surface of a vibration plate substrate and bonding the first structure to the first surface of the vibration plate substrate; processing the vibration plate substrate into a vibration plate by polishing or etching a second surface of the vibration plate substrate to which the first structure is bonded; preparing a laminate structure by disposing a second facing electrode layer of the second structure to face an exposed surface of the vibration plate and bonding the second structure to the vibration plate; and removing at least a part of a first silicon substrate of the first structure and a second silicon substrate of the second structure from the laminate structure.

13 Claims, 4 Drawing Sheets

(51) Int. Cl.
  *H01L 41/316* (2013.01)
  *H01L 41/313* (2013.01)
  *H01L 41/08* (2006.01)

(52) U.S. Cl.
  CPC ........ *H01L 41/094* (2013.01); *H01L 41/0973* (2013.01); *H01L 41/1876* (2013.01); *H01L 41/313* (2013.01); *H01L 41/316* (2013.01)

(58) Field of Classification Search
  USPC ........................................................ 310/358
  See application file for complete search history.

(56) References Cited

U.S. PATENT DOCUMENTS

| 2011/0121096 | A1 | 5/2011 | Nihei et al. | |
|---|---|---|---|---|
| 2014/0083971 | A1* | 3/2014 | Fuju | C09K 13/08 216/13 |
| 2014/0321677 | A1* | 10/2014 | Fukuoka | H04R 17/00 381/191 |
| 2016/0240768 | A1 | 8/2016 | Fujii et al. | |

FOREIGN PATENT DOCUMENTS

| JP | 2003-133605 A | 5/2003 |
|---|---|---|
| JP | 2005-203750 A | 7/2005 |
| JP | 2006-048302 A | 2/2006 |
| JP | 2007-005374 A | 1/2007 |
| JP | 2010-034149 A | 2/2010 |
| JP | 2010-034448 A | 2/2010 |
| JP | 2015-088521 A | 5/2015 |

OTHER PUBLICATIONS

International Preliminary Report on Patentability issued in PCT/JP2016/003037; dated Jun. 2, 2017.

An Office Action mailed by the Japanese Patent Office dated Aug. 7, 2018, which corresponds to Japanese Patent Application No. 2015-131539 and is related to U.S. Appl. No. 15/846,258.

Written Opinion issued in PCT/JP2016/003037; dated Oct. 18, 2016.

* cited by examiner

LAMINATE STRUCTURE, PIEZOELECTRIC ELEMENT, AND METHOD OF MANUFACTURING PIEZOELECTRIC ELEMENT

CROSS-REFERENCE TO RELATED APPLICATIONS

This application is a continuation application of International Application No. PCT/JP2016/003037 filed Jun. 23, 2016, which claims priority under 35 U.S.C. § 119(a) to Japanese Patent Application No. 2015-131539, filed Jun. 30, 2015. Each of the above applications is hereby expressly incorporated by reference, in its entirety, into the present application.

BACKGROUND OF THE INVENTION

1. Field of the Invention

The present invention relates to a laminate structure for a piezoelectric element in which a piezoelectric portion is provided on each of opposite surfaces of a vibration plate, a piezoelectric element, and a method of manufacturing a piezoelectric element.

2. Description of the Related Art

As a piezoelectric actuator of the related art, a unimorph actuator having a structure in which an upper electrode, a piezoelectric body, a lower electrode, and a vibration plate are laminated is generally known. The generative force of the unimorph actuator is substantially determined from a product of a piezoelectric constant of a piezoelectric body and an applied voltage. Since the piezoelectric constant is determined depending on the material, there is a physical limit in the generative force of the unimorph actuator.

As an actuator having a higher generative force than that of the unimorph actuator, JP2005-203750A discloses an actuator which has a bimorph structure having a configuration in which two piezoelectric layers are laminated (refer to FIG. 7 of JP2005-203750A). The bimorph actuator disclosed in JP2005-203750A is manufactured by bonding two structures including a piezoelectric thin film element to each other (refer to paragraphs "0070" to "0071" of JP2005-203750A).

In addition, JP2006-48302A discloses a configuration in which a part of a piezoelectric bimorph actuator using a laminated piezoelectric body is used as a force detecting sensor. The bimorph actuator disclosed in JP2006-48302A is manufactured by bonding two film-shaped piezoelectric bodies to front and back surfaces of a conductive member for a common electrode (refer to paragraph "0074" and FIG. 3 of JP2006-48302A).

Likewise, JP2007-5374A discloses a method of manufacturing a bimorph piezoelectric element by bonding electrode layers of two film-shaped piezoelectric elements through an adhesive (refer to FIGS. 2 and 3 of JP2007-5374A).

Further, JP2015-88521A discloses a bimorph piezoelectric element in which two piezoelectric films are provided with an interlayer having a thickness of 0.4 μm to 10 μm interposed therebetween. JP2015-88521A discloses a method of manufacturing a bimorph piezoelectric element including: forming a first thin film piezoelectric element including a first piezoelectric film on a silicon substrate; forming an interlayer that functions as a vibration plate; and forming a second thin film piezoelectric element including a second piezoelectric film on the interlayer.

SUMMARY OF THE INVENTION

However, a bimorph piezoelectric element having a configuration in which two thin film piezoelectric elements are bonded as disclosed in JP2005-203750A, JP2006-48302A, and JP2007-5374A has low rigidity and thus cannot be used as a driving source of a device having a high resonance frequency. In addition, it is difficult to handle film piezoelectric elements during bonding. Therefore, there is a problem in that it is difficult to improve productivity.

The bimorph piezoelectric element disclosed in JP2015-88521A is manufactured using only a film formation method. Therefore, it is also difficult to manufacture an element having sufficient rigidity. In addition, in a case where a piezoelectric film is manufactured using a vapor deposition method as disclosed in JP2015-88521A by adopting a piezoelectric film formed of a perovskite type oxide such as lead zirconate titanate (PZT) in order to obtain high piezoelectricity, spontaneous polarization occurs in the piezoelectric film from a substrate surface side to a film growth surface. Accordingly, in an element structure in which layers are sequentially formed using a film formation method as disclosed in JP2015-88521A, spontaneous polarization directions of the first piezoelectric film and the second piezoelectric film are the same. Therefore, in a case where an interlayer side-electrodes of the first thin film piezoelectric element and the second thin film piezoelectric element are a common electrode, a difference in potential between the other electrode of the first thin film piezoelectric element and the other electrode of the second thin film piezoelectric element increases, and a load is applied to a drive circuit.

In addition, in a case where a piezoelectric film formed of a perovskite type oxide is manufactured using a vapor deposition method, a heterogeneous phase such as pyrochlore grows in a substrate surface-side interface. Therefore, in the actuator disclosed in JP2015-88521A, a pyrochlore type oxide layer of at least one piezoelectric film is formed on the interlayer side that functions as a vibration plate. During driving, the pyrochlore on the vibration plate side is likely to cause cracking, and sufficient durability may not be obtained. The vibration plate side of the piezoelectric film is bound. Therefore, in a case where pyrochlore is present on the vibration plate side, stress is likely to be concentrated on the pyrochlore layer. Thus, the pyrochlore layer which is a heterogeneous phase is likely to cause cracking. On the other hand, on the side of the piezoelectric film opposite to the substrate, the binding force is low. Therefore, even in a case where a pyrochlore layer is present to some extent, cracking is likely to occur.

The present invention has been made in consideration of the above-described circumstances, and an object thereof is to provide a bimorph piezoelectric element having high rigidity and high durability, a method of manufacturing the same, and a laminate structure for a piezoelectric element.

According to the present invention, there is provided a laminate structure comprising: a vibration plate having a thickness of more than 10 μm and 500 μm or less; a first structure that is bonded to a first surface of the vibration plate; and a second structure that is bonded to a second surface of the vibration plate, in which the first structure includes a first silicon substrate and includes a first electrode layer, a first piezoelectric film, and a first facing electrode layer that are sequentially laminated on one surface of the first silicon substrate, the first facing electrode layer is disposed to face the first surface of the vibration plate and is bonded to the first surface of the vibration plate, the second structure includes a second silicon substrate and includes a second electrode layer, a second piezoelectric film, and a second facing electrode layer that are sequentially laminated on one surface of the second silicon substrate, the second facing electrode layer is disposed to face the second surface of the vibration plate and is bonded to the second surface of the vibration plate, the first piezoelectric film and the second piezoelectric film are formed of a perovskite type oxide, and pyrochlore type oxide layers having a thickness of 3 nm or more are formed in an interface between the first piezoelectric film and the first electrode layer and in an interface between the second piezoelectric film and the second electrode layer, respectively.

In the laminate structure according to the present invention, a first adhesive layer may be provided between the first facing electrode layer and the vibration plate, and a second adhesive layer may be provided between the second facing electrode layer and the vibration plate.

The first adhesive layer and the second adhesive layer may be formed of an organic material but is preferably formed of an inorganic material.

In the laminate structure according to the present invention, it is preferable that the first piezoelectric film is formed using a sputtering method, that a spontaneous polarization vector of the first piezoelectric film is directed from the first electrode layer to the first facing electrode layer, and that a spontaneous polarization vector of the second piezoelectric film is directed from the second electrode layer to the second facing electrode layer.

In the laminate structure according to the present invention, the first facing electrode layer and the second facing electrode layer may be patterned.

In the laminate structure according to the present invention, it is preferable that the vibration plate is formed of silicon.

In the laminate structure according to the present invention, it is preferable that the first structure and the second structure are symmetrical to each other with respect to the vibration plate, and that compositions of the perovskite type oxides which form the first piezoelectric film and the second piezoelectric film, respectively, are the same.

In the laminate structure according to the present invention, the perovskite type oxides which form the first piezoelectric film and the second piezoelectric film are not particularly limited and may be one perovskite type oxide or a plurality of perovskite type oxides represented by the following Formula (P).

$$ABO_3 \qquad (P)$$

(In Formula P, A represents an A-site element which is at least one element selected from the group consisting of Pb, Ba, La, Sr, Bi, Li, Na, Ca, Cd, Mg, and K;

B represents a B-site element which contains at least one element selected from the group consisting of Ti, Zr, V, Nb, Ta, Cr, Mo, W, Mn, Sc, Co, Cu, In, Sn, Ga, Zn, Cd, Fe, and Ni;

O represents an oxygen atom; and the mol number of the A-site element and the mol number of the B-site element are 1.0 as a standard but may deviate from 1.0 within a range where a perovskite structure can be obtained.)

It is more preferable that the perovskite type oxides are represented by the following Formula PX.

In Formula PX, A represents an A-site element which is at least one element including Pb, M represents a B-site element which is at least one element selected from the group consisting of V, Nb, Ta, and Sb. 0<x<b, 0<y<b, 0≤b-x-y, and the molar ratio a:b:c is 1:1:3 as a standard but may deviate from the standard molar ratio within a range where a perovskite structure can be obtained.

According to the present invention, there is provided a piezoelectric element which is obtained by removing at least a part of the first silicon substrate and the second silicon substrate from the laminate structure according to the present invention.

That is, the piezoelectric element according to the present invention is obtained by laminating a first electrode layer, a first piezoelectric film, a first facing electrode layer, a vibration plate having a thickness of more than 10 μm and 500 μm or less, a second facing electrode layer, a second piezoelectric film, and a second electrode layer in this order on one surface of a silicon substrate, in which the first piezoelectric film and the second piezoelectric film are formed of a perovskite type oxide, and pyrochlore type oxide layers having a thickness of 3 nm or more are formed in an interface between the first piezoelectric film and the first electrode layer and in an interface between the second piezoelectric film and the second electrode layer, respectively.

In the piezoelectric element according to the present invention, a first adhesive layer may be provided between the first facing electrode layer and the vibration plate, and a second adhesive layer may be provided between the second facing electrode layer and the vibration plate.

According to the present invention, there is provided a method of manufacturing a piezoelectric element comprising:

a step of preparing a first structure by laminating a first electrode layer, a first piezoelectric film, and a first facing electrode layer in this order on one surface of a first silicon substrate;

a step of preparing a second structure by laminating a second electrode layer, a second piezoelectric film, and a second facing electrode layer in this order on one surface of a second silicon substrate;

a step of disposing the first facing electrode layer to face a first surface of a vibration plate substrate and bonding the first structure to the first surface of the vibration plate substrate;

a step of processing the vibration plate substrate into a vibration plate by polishing or etching a second surface of the vibration plate substrate to which the first structure is bonded;

a step of preparing a laminate structure by disposing the second facing electrode layer to face an exposed surface of the vibration plate to which the first structure is not bonded and bonding the second structure to the exposed surface; and a step of removing at least a part of the first silicon substrate and the second silicon substrate from the laminate structure.

In the method of manufacturing a piezoelectric element according to the present invention, the first piezoelectric film and the second piezoelectric film may be formed of any material, and a method of forming each of the piezoelectric films is not particularly limited. However, it is preferable that, as the first piezoelectric film and the second piezoelectric film, a perovskite type oxide film is formed using a sputtering method. It is more preferable that the perovskite type oxide film is formed of a perovskite type oxide represented by Formula P or PX.

In addition, in the step of processing the vibration plate substrate into the vibration plate, it is preferable that a thickness of the vibration plate substrate is adjusted to be more than 10 μm and 500 μm or less to obtain the vibration plate.

It is preferable that a patterned electrode layer is formed as the first facing electrode layer in the step of preparing the first structure, and that a patterned electrode layer is formed as the second facing electrode layer in the step of preparing the second structure.

In the step of bonding the first structure to the first surface of the vibration plate substrate, it is preferable that an adhesive layer formed of an inorganic material is formed at least either on the first surface of the vibration plate substrate or on a surface of the first facing electrode layer, and that the first surface and the surface of the first facing electrode layer are bonded to each other through the adhesive layer.

In the step of preparing the laminate structure by bonding the second structure to the exposed surface of the vibration plate, it is preferable that an adhesive layer formed of an inorganic material is formed at least either on the exposed surface of the vibration plate or on a surface of the second facing electrode layer, and that the exposed surface of the vibration plate and the surface of the second facing electrode layer are bonded to each other through the adhesive layer.

In the method of manufacturing a piezoelectric element according to the present invention, it is preferable that a silicon substrate is used as the vibration plate substrate.

With the laminate structure according to the present invention, a bimorph piezoelectric element having sufficiently high rigidity in a case where the thickness of the vibration plate is more than 10 μm and 500 μm or less can be prepared. In addition, the pyrochlore type oxide layers are formed in the interfaces of the piezoelectric films opposite to the vibration plate side. Therefore, a piezoelectric element having higher withstand voltage and higher durability than those in a case where the pyrochlore type oxide layers are formed on the vibration plate side can be obtained.

DESCRIPTION OF THE PREFERRED EMBODIMENTS

Hereinafter, an embodiment of the present invention will be described in detail with reference to the drawings.

Figure 1:
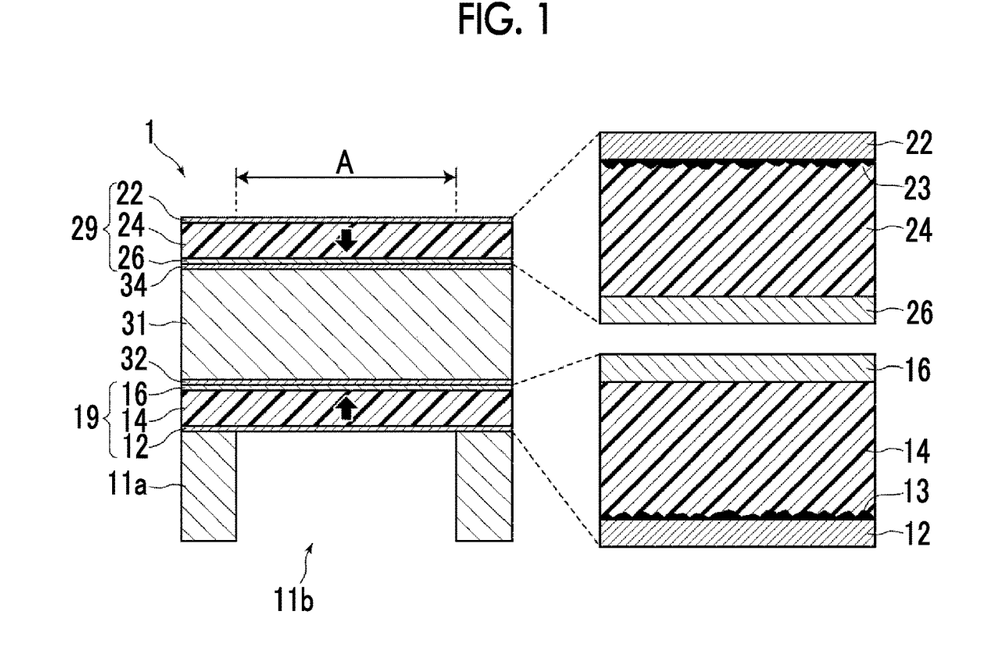
FIG. 1 is a schematic cross-sectional view showing a laminate structure of an embodiment of a piezoelectric element according to the present invention.

FIG. 1 is a cross-sectional view showing a configuration example of a piezoelectric element 1 according to an embodiment of the present invention. In order to easily recognize components, the thickness and proportion of each layer are appropriately changed and do not necessarily reflect the actual thickness and proportion thereof (the same shall be applied to the following drawings).

In the piezoelectric element 1 according to the embodiment, a first electrode layer 12, a first piezoelectric film 14, a first facing electrode layer 16, a first adhesive layer 32, a vibration plate 31 having a thickness of more than 10 μm and 500 μm or less, a second adhesive layer 34, a second facing electrode layer 26, a second piezoelectric film 24, and a second electrode layer 22 are laminated in this order on a silicon substrate 11a. That is, the piezoelectric element 1 is a bimorph piezoelectric element in which a first piezoelectric portion 19 and a second piezoelectric portion 29 are provided on opposite surfaces of the vibration plate 31, respectively. The first piezoelectric film 19 includes the first piezoelectric film 14 and includes the first electrode layer 12 and the first facing electrode layer 16 between which the first piezoelectric film 14 is interposed. The second piezoelectric portion 29 includes the second piezoelectric film 24 and includes the second electrode layer 22 and the second facing electrode layer 26 between which the second piezoelectric film 24 is interposed. The first adhesive layer 32 and the second adhesive layer 34 are not necessarily provided.

The first piezoelectric film 14 and the second piezoelectric film 24 are formed of a perovskite type oxide. As shown in a partially enlarged view in FIG. 1, pyrochlore type oxide layers 13 and 23 having an average thickness of 3 nm or more are formed in an interface between the first piezoelectric film 14 and the first electrode layer 12 and in an interface between the second piezoelectric film 24 and the second electrode layer 22, respectively. The average thickness of each of the pyrochlore type oxide layers 13 and 23 is preferably 50 nm or less and more preferably 20 nm or less. On the other hand, substantially no pyrochlore type oxide layers are present in an interface between the first piezoelectric film 14 and the first facing electrode layer 16 and in an interface between the second piezoelectric film 24 and the second facing electrode layer 26, respectively. Here, substantially no pyrochlore type oxide layer being present represents that the average thickness of the pyrochlore type oxide is 2 nm or less (including 0 nm). A method of calculating the average thickness of the pyrochlore type oxide will be described below.

Arrows in the piezoelectric films 14 and 24 shown in FIG. 1 indicate directions (spontaneous polarization vectors) of spontaneous polarization axes in the respective films. The first piezoelectric film 14 and the second piezoelectric film 24 are formed using a sputtering method, and the spontaneous polarization vectors thereof are opposite to each other along a thickness direction. The spontaneous polarization vector of the first piezoelectric film 14 is directed from the first electrode layer 12 to the first facing electrode layer 16, and the spontaneous polarization vector of the second piezoelectric film 24 is directed from the second electrode layer 22 to the second facing electrode layer 26.

The direction of the spontaneous polarization axis is defined as the vector (directed from minus to plus) of the dipole moment generated due to uneven charge distribution. A piezoelectric film effectively expands and contracts along with an increase and a decrease in electric field application intensity in a case where a polarization direction and an electric field application direction match with each other. Therefore, a piezoelectric effect caused by electric-field-induced strains can be effectively obtained.

Materials and thicknesses of the first electrode layer 12, the second electrode layer 22, materials and thicknesses of the first piezoelectric film 14 and the second piezoelectric film 24, and materials and thicknesses of the first facing electrode layer 16 and the second facing electrode layer 26 may be different from each other but are preferably the same as each other, respectively. In a case where the layer structures are symmetrical to each other with respect to vibration plate 31, a device in which the stress balance is good and in which warping does not occur even during a temperature change can be realized.

A recess portion 11b is formed in the silicon substrate 11a. The piezoelectric element 1 has a diaphragm structure in which a portion of a laminate in a position corresponding to an open region A of the recess portion 11b of the silicon substrate 11a functions as a movable portion that is bendable in the thickness direction (vertical direction in FIG. 1), the laminate including the first electrode layer 12, the first piezoelectric film 14, the first facing electrode layer 16, the vibration plate 31, the second facing electrode layer 26, the second piezoelectric film 24, and the second electrode layer 22.

The silicon substrate 11a is a support that supports the laminate including the first electrode layer 12, the first piezoelectric film 14, the first facing electrode layer 16, the vibration plate 31, the second facing electrode layer 26, the second piezoelectric film 24, and the second electrode layer 22. That is, the silicon substrate 11a functions as a fixing portion that fixes an edge of the movable portion corresponding to the open region A of the recess portion 11b.

The piezoelectric element 1 according to the embodiment can be manufactured from the laminate structure according to the present invention.

In this specification, the expression "B is laminated on A" may imply not only a case where B is directly laminated on A in contact with A but also a case where B is laminated on A with one layer or a plurality of layers interposed between A and B.

Figure 2:
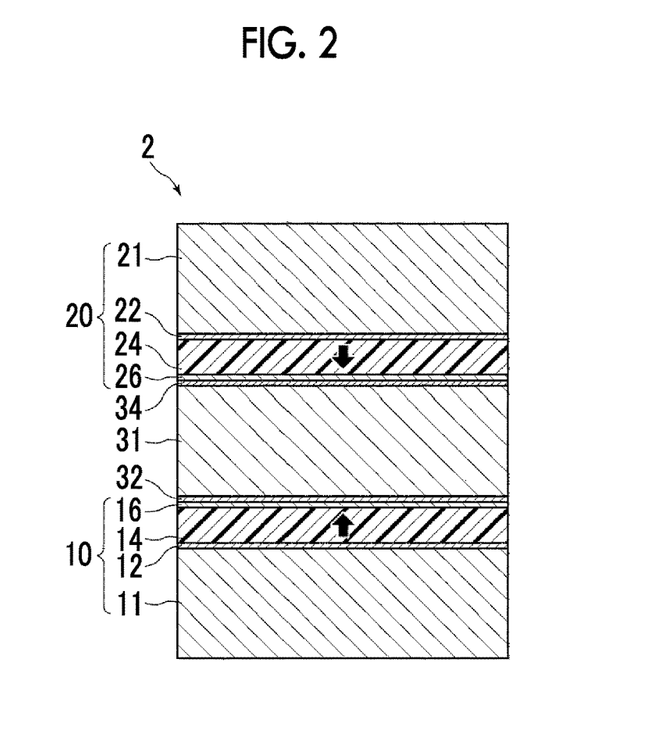
FIG. 2 is a schematic cross-sectional view showing an embodiment of a laminate structure according to the present invention.

FIG. 2 is a schematic cross-sectional view showing a configuration example of a laminate structure 2 for manufacturing the piezoelectric element 1.

The laminate structure 2 according to the embodiment includes: the vibration plate 31 having a thickness of more than 10 μm and 500 μm or less; a first structure 10 that is bonded to a first surface of the vibration plate 31; and a second structure 20 that is bonded to a second surface of the vibration plate 31. The first structure 10 is bonded to the vibration plate 31 through the first adhesive layer 32, and the second structure 20 is bonded to the vibration plate 31 through the second adhesive layer 34.

The first structure 10 includes a first silicon substrate 11 and includes the first electrode layer 12, the first piezoelectric film 14, and the first facing electrode layer 16 that are sequentially laminated on one surface of the first silicon substrate 11, and the first facing electrode layer 16 is disposed to face the first surface of the vibration plate 31 and is bonded to the first surface of the vibration plate 31. The second structure 20 includes a second silicon substrate 21 and includes the second electrode layer 22, the second piezoelectric film 24, and the second facing electrode layer 26 that are sequentially laminated on one surface of the second silicon substrate 21, and the second facing electrode layer 26 is disposed to face the second surface of the vibration plate 31 and is bonded to the second surface of the vibration plate 31.

The first piezoelectric film 14 and the second piezoelectric film 24 are formed of a perovskite type oxide, and the pyrochlore type oxide layers 13 and 23 having a thickness of 3 nm or more are formed in an interface between the first piezoelectric film 14 and the first electrode layer 12 and in an interface between the second piezoelectric film 24 and the second electrode layer 22, respectively (refer to the enlarged view of FIG. 1).

By removing the second silicon substrate 21 and a part of the first silicon substrate 11 from the laminate structure 2, the piezoelectric element 1 shown in FIG. 1 can be obtained.

A method of manufacturing the piezoelectric element 1 shown in FIG. 1 will be described as an embodiment of a method of manufacturing a piezoelectric element according to the present invention with reference to FIGS. 3A to 3C, 4A, and 4B.

The method of manufacturing a piezoelectric element according to the present invention includes: a step I (refer to I in FIG. 3A) of preparing the first structure 10 by laminating the first electrode layer 12, the first piezoelectric film 14, and the first facing electrode layer 16 in this order on one surface of the first silicon substrate 11; a step II (refer to II in FIG. 3B) of preparing the second structure 20 by laminating the second electrode layer 22, the second piezoelectric film 24, and the second facing electrode layer 26 in this order on one surface of the second silicon substrate 21; a step III (refer to III in FIG. 3C) of disposing the first facing electrode layer 16 to face a first surface 30a of a vibration plate substrate 30 and bonding the first structure 10 to the first surface 30a of the vibration plate substrate 30; a step IV (refer to IV in FIG. 4A) of adjusting the thickness of the vibration plate substrate 30 to obtain the vibration plate 31 by polishing or etching a second surface 30b of the vibration plate substrate 30; a step V (refer to V in FIG. 4B) of preparing the laminate structure 2 by disposing the second facing electrode layer 26 to face the second surface of the vibration plate substrate having the adjusted thickness (that is, the vibration plate 31) and bonding the second structure 20 to the second surface of the vibration plate substrate; and a step VI of removing at least a part of the first silicon substrate 11 and the second silicon substrate 21 from the laminate structure 2 (refer to FIG. 1). Hereinafter, the respective steps will be described in more detail.

Figure 3A:
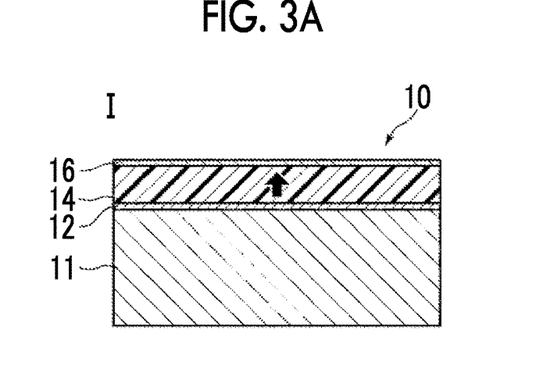
FIG. 3A is a diagram showing a manufacturing step I of the piezoelectric element shown in FIG. 1.

[Step I: Preparation of First Structure]

The first electrode layer 12, the first piezoelectric film 14, and the first facing electrode layer 16 are laminated in this order on one surface of the first silicon substrate 11. As the first silicon substrate 11, a silicon wafer (a non-SOI substrate not having a SOI structure) as a standard commercially available product is preferably used. A $SiO_2$ film (oxide film) may be formed on a surface of the silicon wafer.

The respective layers are formed on the first silicon substrate 11 using a thin film formation method. Examples of the thin film formation method include a physical vapor deposition (PVD) method, a chemical vapor deposition (CVD) method, a liquid phase film formation method (for example, plating, coating, a sol-gel method, or a spin coating method), and a thermal oxidation method. An appropriate film formation method can be selected for each layer, but it is most preferable that all the layers are formed using a vapor deposition method. Using the vapor deposition method, the thickness can be controlled with high accuracy. In addition, a material is inexpensive, a film formation rate is high, and mass productivity is high. Therefore, the costs of a device can be reduced. It is more preferable that the respective layers are formed using a sputtering method.

A material of the first electrode layer 12 is not particularly limited and may be a metal or a conductive oxide material. Specifically, a material such as platinum (Pt), aluminum (Al), molybdenum (Mo), titanium nitride (TiN), ruthenium (Ru), gold (Au), silver (Ag), iridium (Ir), or indium tin oxide (ITO) can be used. In addition, in order to improve adhesiveness with the first silicon substrate 11, an adhesion layer formed of Ti, TiW, or the like may be provided between the first silicon substrate 11 and the first electrode layer 12.

The thickness of the first electrode layer 12 can be appropriately designed and is preferably 50 to 500 nm. In a case where the electrode layer is excessively thick, the rigidity of the electrode portion increases, and the displacement of the piezoelectric film may be limited. Therefore, the thickness of the first electrode layer 12 is more preferably 50 to 300 nm.

In the piezoelectric element 1 according to the embodiment, the first piezoelectric film 14 is formed of a perovskite type oxide, and is formed with a method for increasing the substrate temperature (to preferably 400° C. or higher) to cause crystallization during the film formation using a vapor deposition method represented by a sputtering method. The method of forming the piezoelectric film is not limited to a sputtering method and, for example, various methods such as a sputtering method, an ion plating method, a metal organic chemical vapor deposition (MOCVD) method, or a pulsed laser deposition (PLD) method can be used. In addition, a method other than a vapor deposition method (for example, a sol-gel method) may be used.

However, by directly forming a piezoelectric film on a substrate using a sputtering method to reduce the thickness of the piezoelectric film, the manufacturing process can be simplified.

In the method of manufacturing a piezoelectric element according to the present invention, the piezoelectric film is not limited to a film formed of a perovskite type oxide.

The thickness of the first piezoelectric film 14 is preferably 0.3 µm to 10 µm, more preferably 0.5 µm to 8 µm, and still more preferably 1 µm to 7 µm. In a case where the thickness of the first piezoelectric film 14 is 0.3 µm or more, sufficient driving power for an actuator can be exhibited. In addition, a sufficient voltage signal for a sensor or a power generation device can be extracted. In addition, in a case where the thickness of the first piezoelectric film 14 is 0.3 µm or more, breakage caused by a leakage current can be suppressed. Further, the crystallinity of the piezoelectric body does not deteriorate, and necessary piezoelectric performance is likely to be obtained. In addition, in a case where the thickness of the first piezoelectric film 14 is 10 µm or less, cracking is suppressed, and peeling is not likely to occur.

During formation of a perovskite type oxide piezoelectric film, a pyrochlore type oxide layer is likely to be formed in an interface with a deposition surface on which the perovskite type piezoelectric film is formed. In this example, during the formation of the first piezoelectric film 14, the pyrochlore type oxide layer 13 is formed in the interface with the first electrode layer 12. During the formation of the second piezoelectric film 24, the pyrochlore type oxide layer 23 is formed in the interface with the second electrode layer 22 (refer to FIG. 1). The growth of the pyrochlore type oxide layer can be suppressed depending on film forming conditions. However, it is extremely difficult to adjust the average thickness of the pyrochlore type oxide layer to be less than 3 nm. In a case where film forming conditions for suppressing the growth of the pyrochlore type oxide is not used, a pyrochlore type oxide layer having an average thickness of more than 60 nm may also be formed.

As a material of the first facing electrode layer 16, Ir is preferable. However, the material of the first facing electrode layer 16 is not limited to Ir and may be another conductive material. The thickness of the first facing electrode layer 16 is not particularly limited and is preferably 50 nm to 500 nm.

The pressure and temperature may be returned to the atmospheric pressure and room temperature after the formation of each film, or the films may be continuously formed without any change in pressure and temperature. In addition, optionally, film patterning may be performed. Film formation using a material other than PZT may be performed at room temperature. However, from the viewpoint of durability, it is preferable that the material other than PZT is heated to form a film because stress applied to PZT can be reduced.

Figure 3B:
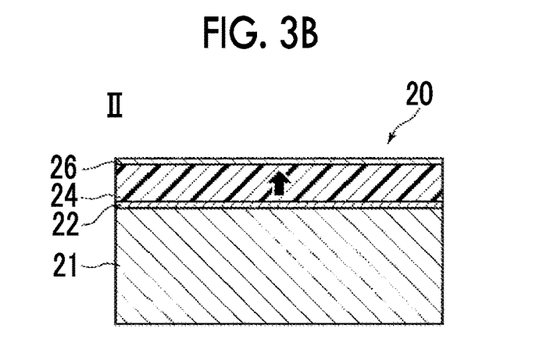
FIG. 3B is a diagram showing a manufacturing step II of the piezoelectric element shown in FIG. 1.

[Step II: Preparation of Second Structure]

The second electrode layer 22, the second piezoelectric film 24, and the second facing electrode layer 26 are laminated in this order on one surface of the second silicon substrate 21. As the second silicon substrate 21, as in the case of the first silicon substrate 11, a silicon wafer as a standard commercially available product is preferably used. In addition, the details of the second electrode layer 22, the second piezoelectric film 24, and the second facing electrode layer 26 are the same as those of the first electrode layer 12, the first piezoelectric film 14, and the first facing electrode layer 16.

In the laminate structure 2 and the piezoelectric element 1, materials and thicknesses of the first electrode layer 12, the second electrode layer 22, materials and thicknesses of the first piezoelectric film 14 and the second piezoelectric film 24, and materials and thicknesses of the first facing electrode layer 16 and the second facing electrode layer 26 may be different from each other but are preferably the same as each other, respectively. In the piezoelectric element, a problem of warping may occur in the device depending on the usage environment. The main reason why warping occurs is a difference between the thermal expansion coefficients of the piezoelectric material used in the piezoelectric films (14, 24) and the material of the vibration plate 31. In a case where the structures are symmetrical to each other with respect to the vibration plate 31, a device in which the stress balance between the front and back surfaces of the vibration plate is good and in which substantially no warping occurs without depending on the usage environment can be obtained. In a case where a ratio of the thickness of the second piezoelectric film 24 to the thickness of the first piezoelectric film 14 is in a range of 0.25 to 4, the amount of warpage can be relatively suppressed.

Figure 3C:
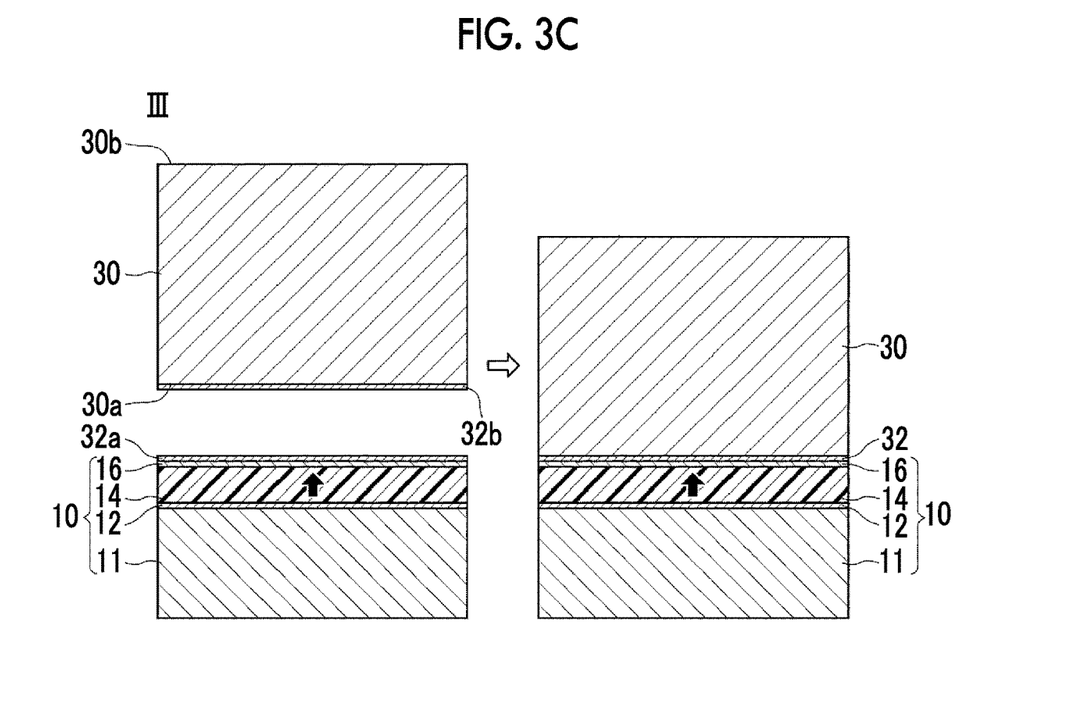
FIG. 3C is a diagram showing a manufacturing step III of the piezoelectric element shown in FIG. 1.

[Step III: Adhesion Between First Structure and Vibration Plate Substrate]

Adhesive layers 32a and 32b are formed on the first surface 30a of the vibration plate substrate 30 and a surface of the first facing electrode layer 16 in the first structure 10, respectively. Next, the first structure 10 is bonded to the first surface 30a of the vibration plate substrate 30 through the first adhesive layer 32. For example, inorganic solder films formed of Au—Sn or the like are formed as the adhesive layers 32a and 32b and are heated during the bonding. As a result, the layers are bonded by Au—Sn eutectic bonding. Only one of the adhesive layers 32a and 32b may be formed. In addition, the adhesion may be realized using a method other than eutectic bonding.

As a material of the adhesive layer, an organic material may be used, but an inorganic material such as an inorganic solder material is preferably used due to high durability thereof. The inorganic material is not necessarily a solder material. A normal-temperature bonding method may be used in which a surface active treatment is performed on two surfaces to be bonded such that the two surfaces are closely bonded to each other. In a case where the normal-temperature bonding method is used, a laminate structure and a piezoelectric element including no adhesive layer can be obtained.

As the vibration plate substrate 30, a silicon substrate, a glass substrate, or various ceramic substrates can be used. In addition, the vibration plate substrate 30 may be a stainless steel substrate or a metal substrate. Substrates formed of various materials can be used as the vibration plate substrate. Therefore, the degree of freedom in design is extremely high. From the viewpoints of easily adjusting the thickness, improving handleability, and reducing the costs, a silicon substrate is more preferable.

From the viewpoint of improving handleability, as the vibration plate substrate 30, a substrate having a thickness of 200 μm or more is preferably used, and a substrate having a thickness of 500 μm or more is preferably used.

Figure 4A:
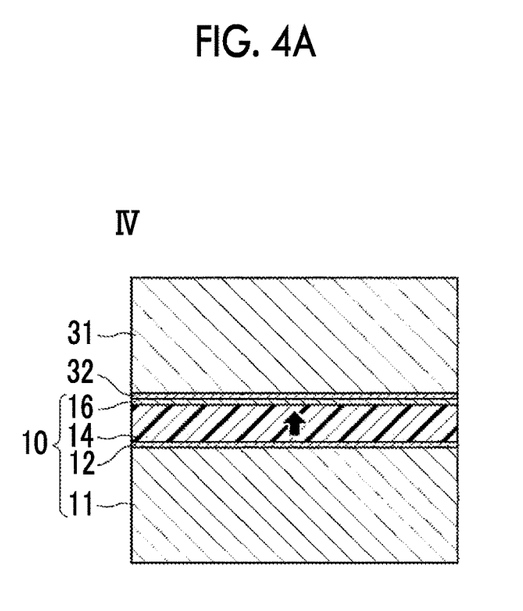
FIG. 4A is a diagram showing a step IV of manufacturing the piezoelectric element shown in FIG. 1.

[Step IV: Vibration Plate Processing]

After the step III, the thickness of the vibration plate substrate 30 is adjusted to obtain the vibration plate 31 by polishing or etching the second surface 30b of the vibration plate substrate 30. The vibration plate 31 of the piezoelectric element is polished or etched to have a thickness which is designed according to the use. The thickness of the vibration plate 31 is preferably more than 10 μm and 500 μm or less and more preferably 20 μm to 300 μm.

Figure 4B:
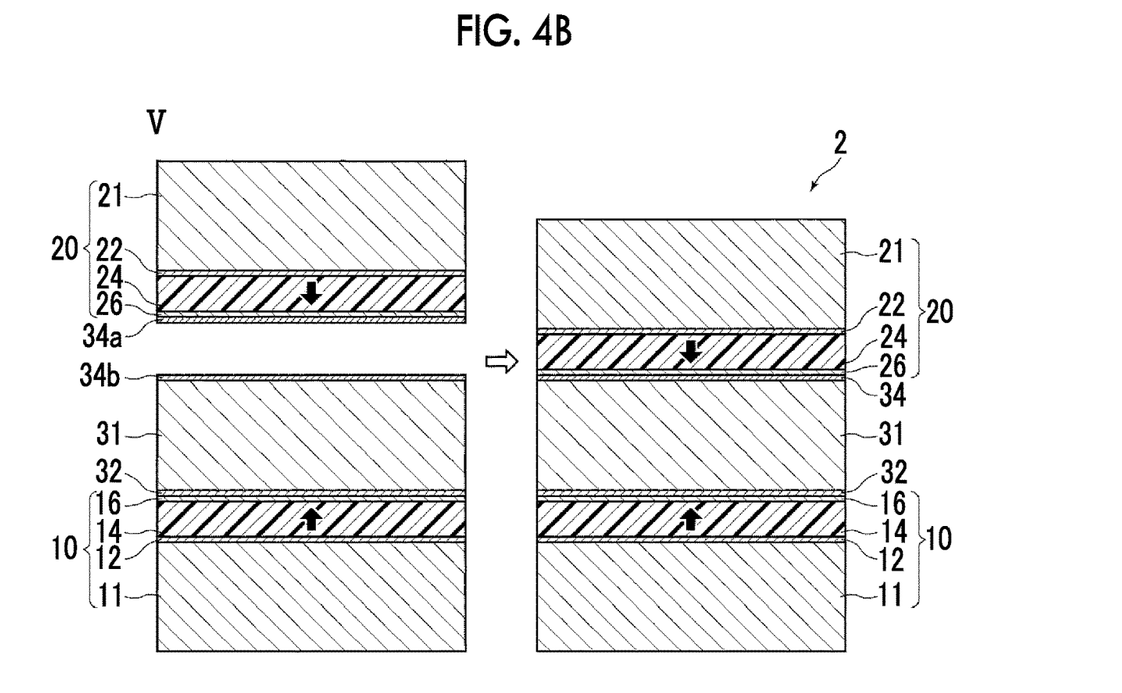
FIG. 4B is a diagram showing a step V of manufacturing the piezoelectric element shown in FIG. 1.

[Step V: Preparation of Laminate Structure]

After the step IV, adhesive layers 34a and 34b are formed on a surface of the vibration plate 31, which is exposed after the polishing or etching of the vibration plate substrate 30, and a surface of the second facing electrode layer 26 in the second structure 20, respectively. Next, the second structure 20 is bonded to the exposed surface of the vibration plate 31 (that is, the polished vibration plate substrate 30) through the second adhesive layer 34. As a result, the laminate structure 2 is prepared. The material and the bonding method of the adhesive layer are the same as those used to bond the first structure 10 and the vibration plate substrate 30.

[Step VI: Element Formation]

At least a part of the first silicon substrate 11 and the second silicon substrate 21 is removed from the laminate structure 2 obtained as described above. As a result, the piezoelectric element 1 is formed. More specifically, the laminate structure 2 is patterned by dry-etching in a desired device shape. Next, the second silicon substrate 21 is removed, and a part of the first silicon substrate 11 is removed to form the recess portion 11b. As a result, the diaphragm structure (refer to FIG. 1) in which the silicon substrate 11a including the recess portion 11b is the support is formed. In order to remove the first silicon substrate 11 and the second silicon substrate 21, a well-known etching technique such as dry etching or wet etching can be applied. In particular, reactive ion etching (RIE) is preferable.

Through the above-described steps, the piezoelectric element 1 shown in FIG. 1 can be obtained.

In the method of manufacturing a piezoelectric element, all of the first structure 10, the vibration plate substrate 30, and the second structure 20 includes a material having high rigidity such as a silicon substrate. Therefore, the handleability during manufacturing is excellent, and the manufacturing efficiency can be improved. In addition, by bonding the vibration plate substrate 30 to the first structure 10 and then etching them, the vibration plate 31 having a desired thickness can be obtained. Therefore, the degree of freedom in design is extremely high. As compared to a case where the vibration plate is formed using a film formation method, the vibration plate having a large thickness can be simply manufactured, and an element having high rigidity can be obtained.

During the preparation of the first structure and the second structure, by patterning the first facing electrode layer and the second facing electrode layer, a piezoelectric element in which an address electrode is provided on the vibration plate side can be obtained. In this case, during the bonding of the step V, it is necessary to adjust the positions of the first structure and the second structure. In this case, the first facing electrode layer and the second facing electrode layer in the laminate structure are patterned electrodes, respectively.

On the other hand, in a case where a patterned electrode is not formed during the preparation of the first structure and the second structure, it is not necessary to adjust the positions the first structure and the second structure for bonding. However, during the formation of the piezoelectric element from the laminate structure, it is necessary to pattern the first electrode layer and the second electrode layer which are exposed after removing the first silicon substrate and the second silicon substrate.

It is preferable that the first piezoelectric film 14 and the second piezoelectric film 24 are formed of one perovskite type oxide or a plurality of perovskite type oxides represented by the following Formula (P).

$$ABO_3 \tag{P}$$

(In Formula P, A represents an A-site element which is at least one element selected from the group consisting of Pb, Ba, La, Sr, Bi, Li, Na, Ca, Cd, Mg, and K;

B represents a B-site element which contains at least one element selected from the group consisting of Ti, Zr, V, Nb, Ta, Cr, Mo, W, Mn, Sc, Co, Cu, In, Sn, Ga, Zn, Cd, Fe, and Ni;

O represents an oxygen atom; and the mol number of the A-site element and the mol number of the B-site element are 1.0 as a standard but may deviate from 1.0 within a range where a perovskite structure can be obtained.)

Examples of the perovskite type oxide represented by the above formula include a lead-containing compound such as lead titanate, lead zirconate titanate (PZT), lead zirconate, lead lanthanum titanate, lead lanthanum zirconate titanate, lead magnesium niobate-lead zirconate titanate, lead nickel niobate-lead zirconate titanate, or lead zinc niobate-lead zirconate titanate, and a mixed crystal system thereof; and a lead non-containing compound such as barium titanate, strontium barium titanate, bismuth sodium titanate, bismuth potassium titanate, sodium niobate, potassium niobate, lithium niobate, or bismuth ferrite, and a mixed crystal system thereof.

In addition, it is preferable that the piezoelectric film according to the embodiment includes one perovskite type oxide or two or more perovskite type oxides represented by the following Formula PX.

$$A_a(Zr_x,Ti_y,M_{b-x-y})_bO_c \quad (PX)$$

(in Formula PX, A represents an A-site element which is at least one element including Pb; M represents at least one element selected from the group consisting of V, Nb, Ta, and Sb; 0<x<b; 0<y<b; 0≤b-x-y; and the molar ratio a:b:c is 1:1:3 as a standard but may deviate from the standard molar ratio within a range where a perovskite structure can be obtained)

The perovskite type oxide (PX) is pure PZT or an oxide obtained by substituting or a portion of the B-site element in PZT with M. It is known that, in PZT to which various donor ions having a higher valence than substituted ions are added, characteristics such as piezoelectric performance are improved to be higher than those of pure PZT. It is preferable that M represents one kind or two or more kinds of donor ions having a higher valence than tetravalent Zr or Ti ions. Examples of the donor ions include $V^{5+}$, $Nb^{5+}$, $Ta^{5+}$, $Sb^{5+}$, $Mo^{6+}$, and $W^{6+}$.

b-x-y is not particularly limited within a range where a perovskite structure can be adopted. For example, in a case where M represents Nb, a molar ratio of Nb/(Zr+Ti+Nb) is preferably 0.05 to 0.25 and more preferably 0.06 to 0.20.

A piezoelectric film which is formed of the perovskite type oxide represented by Formula (P) or (PX) described above has a high piezoelectric constant ($d_{31}$ constant). Therefore, a piezoelectric element including the piezoelectric film is superior in displacement characteristics and detection characteristics.

In particular, a Nb-doped PZT (hereinafter, referred to as Nb-PZT) film represented by $Pb_a(Zr_x,Ti_y,Nb_{b-x-y})_bO_c$ in which the A site is Pb and M is Nb in Formula (PX) is preferable because spontaneous polarization occurs in the as-deposited state (asdepo state), the piezoelectric performance is high, and the spontaneous polarization does not disappear even in a case where eutectic bonding which requires a high-temperature treatment is used to bond the first structure, the vibration plate substrate, and the second structure.

In order to practice the present invention, not only a Pb-based perovskite type piezoelectric material but also a non-lead perovskite type piezoelectric material can also be suitably used. In addition, in the method of manufacturing a piezoelectric element according to the present invention, not only a piezoelectric material formed of a perovskite type oxide but also any other materials can be adopted as long as they are piezoelectric materials with which a thin film can be formed.

In addition, it is preferable that the piezoelectric films 14 and 24 are columnar-structure films including a plurality of columnar crystals which extend in a direction non-parallel to the substrate surface because high piezoelectric performance can be obtained. In the film structure including a plurality of columnar crystals which extend in the direction non-parallel to the substrate surface, an oriented film with an aligned crystal orientation can be obtained. For example, in a case where a PZT-based piezoelectric film is formed using a non-thermal equilibrium process such as a sputtering method, a (100)-oriented film structure can be obtained. A growth direction of columnar crystals is not particularly limited as long as it is non-parallel to the substrate surface, and may be a substantially vertical direction or an oblique direction. The average column diameter of a plurality of columnar crystals forming the piezoelectric film is not particularly limited and is preferably 30 nm to 1 µm.

It is known that the piezoelectric performance of a piezoelectric body in a bending mode, that is, a piezoelectric constant $d_{31}$ (pm/V) thereof varies depending on the crystal orientation of the piezoelectric body. In a case where piezoelectric films have the same orientation, these piezoelectric films can be handled under the same driving conditions, and a shift of a stress neutral surface can be suppressed. Therefore, it is preferable that the first piezoelectric film 14 and the second piezoelectric film 24 have the same crystal orientation.

In a case where two piezoelectric films have different orientations, or in a case where one piezoelectric film has a (100) orientation and the other piezoelectric film has a (111) orientation, driving conditions of the piezoelectric films are significantly different from each other, and thus a driving design is complicated.

On the other hand, in this example, the two piezoelectric films (14, 24) have the same configuration so as to have the same orientation. As a result, a driving design is simple, and the piezoelectric films can be driven favorably. In addition, by making the two piezoelectric films (16, 26) to have the same orientation, the amount of strains generated during long-term driving is small, and a device having high reliability can be realized. The piezoelectric films may have a (001) orientation instead of a (100) orientation.

In addition, as described above, the pyrochlore type oxide layers 13 and 23 are formed in the interface between the first piezoelectric film 14 and the first electrode layer 12 and in the interface between the second piezoelectric film 24 and the second electrode layer 22, respectively. According to the manufacturing method, the pyrochlore type oxide layers 13 and 23 are positioned in the interface of the first piezoelectric film 14 distant from the vibration plate 31 and in the interface of the second piezoelectric film 24 distant from the vibration plate 31, respectively. Therefore, a piezoelectric element having high withstand voltage and high durability can be obtained. During operation of the piezoelectric element, the pyrochlore type oxide layer may cause cracking and peeling. In a case where the pyrochlore type oxide layer is present on the side distant from a vibration plate, cracking can be suppressed and durability can be improved as compared to a case where the pyrochlore type oxide layer is present on the vibration plate side of the piezoelectric film.

In general, the pyrochlore type oxide refers to a film represented by the formula $A_2B_2O_7$. Examples of the pyrochlore type oxide which appears as an impurity in the Pb-based piezoelectric body include not only $A_2B_2O_7$ but also $A_3B_4O_{13}$, $A_5B_4O_{15}$, and $A_3B_2O_8$.

<Measurement of Average Thickness of Pyrochlore Type Oxide Layer>

The average thickness of the pyrochlore type oxide layer is measured as follows.

1) Using high-angle annular dark-field scanning transmission electron microscopy (HAADF-STEM), a HAADF-STEM image (in particular, a piezoelectric body-lower electrode interface region) of a cross-section of the piezoelectric film perpendicular to the substrate surface was obtained. This HAADF-STEM image is set as an original image.

2) In the HAADF-STEM image, there is a difference in contrast between the perovskite type oxide layer and the pyrochlore type oxide layer. Using this difference, the pyrochlore type oxide layer is binarized based on a predetermined threshold (for example, in a case where the original image has 255 gray levels, the threshold is about 100 to 150)

using a contrast adjusting function of image processing software, and the binary image is extracted using an edge extraction function of the image processing software. In this case, the threshold is set such that noise is removed as much as possible and the pyrochlore type oxide layer can be clearly recognized. In a case where the contour of the pyrochlore type oxide layer is not clear in the binary image, a contour line is empirically drawn and the inside of the contour is filled while looking at the binary image.

3) The area of the extracted pyrochlore type oxide layer is calculated based on the number of pixels of the image processing software and is divided by the width of the visual field of the HAADF-STEM image to obtain the average thickness of the extracted pyrochlore type oxide layer.

In 1), a sample from which the HAADF-STEM image is obtained is processed to have a uniform thickness of 100 nm in a depth direction (direction perpendicular to the cross-section to be observed). The reason why the HAADF-STEM image is observed to observe the difference in contrast caused by a difference in density between the perovskite type oxide layer and the pyrochlore type oxide layer without the influence of diffraction contrast. In addition, in the measurement, an electron beam is incident in a direction perpendicular to the substrate surface. As the image processing software, for example, Photoshop is used. The reason why the pyrochlore type oxide layer is filled in the binary image is to prevent underestimation of the area.

In the first and second piezoelectric films, in order not only to obtain spontaneous polarization immediately after formation using a sputtering method but also to obtain a desired polarization state after the formation, polarization processing may be performed, for example, using a method of applying a voltage between the electrodes between which each of the piezoelectric films is interposed. The polarization processing may be accompanied by heating. In addition, as a method of the polarization processing, for example, a method such as a corona method may be adopted. In a case where the polarization state during the film formation can be used as it is, for example, in a case where the film is formed using a sputtering method, the polarization processing can be omitted.

As a drive voltage which causes an electric field to act on the piezoelectric film, a positive potential or a negative potential may be selected. Regarding a driving direction, in FIG. 1, whether the vibration plate is bent in a direction so as to protrude upward or downward can be determined based on a relationship between the spontaneous polarization vector of the piezoelectric film and the vibration plate 31.

Further, a phase of a voltage applied to the first piezoelectric film 14 and a phase of a voltage applied to the second piezoelectric film 24 may change. A driving method can be freely selected according to the use and/or purpose of the device. For example, in a case where the first piezoelectric portion 19 and the second piezoelectric portion 29 are driven after shifting phases thereof, a displacement, which is effectively about two times a displacement in a case where only one of the piezoelectric portions is driven, can be realized. For example, in a case where the electrodes on the vibration plate side are connected to the ground potential, a large potential can be obtained by applying a negative AC voltage to the electrodes of the respective piezoelectric bodies opposite to the vibration plate to shift phases of the applied voltages by 180 degrees. As a result, a large displacement can be obtained.

The piezoelectric element 1 according to the embodiment is not limited to the configuration of being used as an actuator and can also be used as a sensor which converts a displacement of the piezoelectric film into an electrical signal or as a power generation device which converts a displacement of the piezoelectric film into electrical energy.

The piezoelectric element 1 according to the embodiment is a bimorph type in which the first piezoelectric portion 19 and the second piezoelectric portion 29 are provided with the vibration plate 31 interposed therebetween. Therefore, the performance of the piezoelectric element can be effectively improved as compared to an unimorph type where only one piezoelectric film (single layer) is provided. For example, in a case where the piezoelectric element having a structure shown in FIG. 1 is used as an actuator, the drive voltage required to obtain a displacement equivalent to that of the configuration where only one (single) piezoelectric film is provided can be reduced to about ½.

That is, in a case where the piezoelectric element 1 according to the embodiment is used as an actuator, a large displacement can be obtained by applying a relatively low drive voltage. In addition, a load on a control circuit including a drive circuit is reduced by a decrease in the drive voltage, and cost reduction, power saving, improvement of durability, and the like can be realized.

In addition, in a case where the piezoelectric element 1 according to the embodiment is used as a sensor, a high voltage signal can be obtained by the piezoelectric films being deformed, and the sensitivity can be improved.

Further, in a case where the piezoelectric element 1 according to the embodiment is used as a power generation device, the power generation voltage can increase by the piezoelectric films being laminated, and the same effect as that of a device whose area is increased in a planar way can be obtained. As a result, a small device having high power generation efficiency can be realized, practically suitable power generation performance can be realized.

The vibration plate 31 is obtained by etching or polishing the vibration plate substrate 30 and has a thickness of more than 10 µm. Therefore, the rigidity of the element as a whole can be improved. In addition, since the rigidity is improved, the piezoelectric element 1 can be used as a driving source of a device having a high resonance frequency. Further, even in a case where the first piezoelectric film 14 and the second piezoelectric film 24 vary in the thickness and the stress, the amount of initial bending can be suppressed to be relatively small, and an appropriate operation for a device can be performed.

In a case where the configurations of the first piezoelectric portion 19 and the second piezoelectric portion 29, which are provided on the opposite surfaces of the vibration plate 31, are symmetrical to each other with respect to the vibration plate 31, a device in which warping does not occur can be obtained irrespective of the environmental temperature.

In the method of manufacturing a piezoelectric element, the first structure and the vibration plate substrate are bonded. Next, the thickness of the vibration plate substrate was reduced by polishing or etching to obtain the vibration plate, and then the second structure is bonded to the vibration plate. In this method, a wafer having high rigidity can be used as at least one of the structures during bonding. Therefore, handleability is high. In addition, the degree of freedom in the design of the thickness of the vibration plate substrate is high. Therefore, the degree of freedom in the design of the device is also improved.

The present invention is not limited to the above-described embodiment, and various modifications can be made by those of ordinary skill in the pertinent field within a range not departing from the technical concepts of the present invention.

EXAMPLES

Examples and Comparative Examples of the present invention will be described.

Example 1

An Nb-PZT film having a thickness of 3 μm as the first piezoelectric film 14 was formed on a silicon wafer having a thickness of 200 μm and having opposite surfaces polished as the first silicon substrate 11 with an Ir electrode layer as the first electrode layer 12 interposed therebetween. An Ir electrode layer as the first facing electrode layer 16 was further formed on the Nb-PZT film. As a result, the first structure 10 was obtained.

Likewise, an Nb-PZT film having a thickness of 3 μm as the second piezoelectric film 24 was formed on a silicon wafer having a thickness of 200 μm as the second silicon substrate 21 with an Ir electrode layer as the second electrode layer 22 interposed therebetween. An Ir electrode layer as the second facing electrode layer 26 was further formed on the Nb-PZT film. As a result, the second structure 20 was obtained.

Each of the Ir electrode layers was obtained to have a thickness of 150 nm using a sputtering method. During the formation, the substrate temperature is set as 350° C.

As each of the Nb-PZT film, a PZT film doped with 13% (atomic composition ratio) of Nb was formed using a sputtering method under conditions where the substrate temperature was about 500° C. when measured using a thermocouple embedded in a dummy Si wafer. In order to form the Nb-PZT film, a high-frequency (radio frequency; RF) magnetron sputtering device is used. As film formation gas, mixed gas containing 97.5% of Ar and 2.5% of $O_2$ is used. As a target material, a material having a composition of $Pb_{1.3}((Zr_{0.52}Ti_{0.48})_{0.88}Nb_{0.12})O_3$ is used. The film formation pressure is set to 2.2 mTorr (0.293 Pa).

The film obtained using the film formation method was oriented to a (100) direction of a perovskite structure. In addition, when a cross-sectional SEM (scanning electron microscopy) image of the film was observed, a small pyrochlore structure was observed in an interface between the electrode and the piezoelectric body. The formation of the Nb-PZT film on the Ir electrode layer of the silicon wafer is non-epitaxial growth. Therefore, it is considered that, during nucleus formation at the initial stage of the film formation, a pyrochlore structure may be formed with a certain probability. Along with the progress of the growth, the film is under film forming conditions which can make a perovskite structure stable. Therefore, the pyrochlore structure is eliminated, and only the perovskite structure remains. In addition, the obtained film was polarized even in a state where polarization processing was not performed.

An Au—Sn film having a thickness of 5 μm as the inorganic adhesive layer 32a was formed on the first facing electrode layer 16 of the first structure 10.

An Au—Sn film having a thickness of 5 μm as the inorganic adhesive layer 32b was formed on one surface of a silicon wafer having a thickness of 500 μm as the vibration plate substrate 30. Next, the surface of the first structure 10 on which the Au—Sn film was formed was bonded to the Au—Sn film of the first silicon substrate 11 while heating the layers at 300° C. By bonding the vibration plate substrate 30 and the first structure 10 at 300° C., the Au—Sn films were melted. As a result, the vibration plate substrate 30 and the first structure 10 were bonded through eutectic bonding such that the surface of the vibration plate substrate and the first facing electrode layer 16 of the first structure 10 faced each other.

After the bonding of the vibration plate substrate 30 and the first structure 10, the silicon wafer having a thickness of 500 μm as the vibration plate substrate 30 was polished into the vibration plate 31 having a thickness of 200 μm.

Next, using the same method as described above, the second structure 20 was bonded to an exposed surface of the vibration plate 31 opposite to the surface to which the first structure 10 was bonded. As a result, the laminate structure 2 was obtained. In the laminate structure 2, substantially no warping occurred.

Next, the second silicon substrate 21 was removed by dry etching, and the first silicon substrate 11 was also removed using the same method. Next, the laminate structure 2 was diced. As a result, a cantilever type device having a configuration shown in FIGS. 5A (top view) and 5B (cross-sectional view taken along line Q-Q' of FIG. 5A) was prepared. In FIG. 5B, the adhesive layers 32 and 34 are not shown. In the cantilever type device, the width was 2 mm, and the length was about 25 mm.

Example 2

A laminate structure was obtained using the same method as in Example 1, except that the thickness of the second piezoelectric film 24 in the second structure 20 was 1 μm. In the laminate structure according to Example 2, in a case where the first structure 10 side including the first piezoelectric film 14 having a thickness of 3 μm was set as the upper side, a 300 μm protrusion protruded downward from the 6-inch wafer as a whole. Here, the protruding of the 300 μm protrusion represents that, in a case where opposite end portions of the wafer are set as a reference position, the distance from the reference position to the center of the wafer, which is the most protruding portion, in the thickness direction of the wafer, that is, the height difference is 300 μm.

Next, a cantilever type device was prepared using the same method as in Example 1.

Comparative Example 1

A Nb-PZT film having a thickness of 3 μm as a piezoelectric film was formed on a silicon wafer having a thickness of 200 μm with an Ir electrode layer interposed therebetween, and an Ir layer as a facing electrode layer was further formed on the Nb-PZT film. This piezoelectric element has the same configuration as that of the first structure and the second structure in Example 1 and is a so-called unimorph piezoelectric element. In this configuration, the silicon wafer having a thickness of 200 μm as the film formation substrate corresponds to the vibration plate. In the obtained structure, the downward protrusion was larger than that of Example 2, and the 6-inch wafer warped by more than 300 μm.

Next, using the same method as in Example 1, a cantilever type device having an unimorph structure in which the piezoelectric portion was provided on only one surface of the vibration plate was prepared.

Comparative Example 2

An Ir electrode layer was formed on each of opposite surfaces of a silicon wafer having a thickness of 200 μm and having opposite surfaces polished, and a Nb-PZT film having a thickness of 3.0 μm was on each of the Ir electrode layers under the same conditions. As a result, a bimorph structure in which the silicon wafer having a thickness of 200 μm was the vibration plate was prepared.

The bimorph structure was diced. As a result, a cantilever type device having the same configuration as in Example 1 was prepared.

Hereinafter, a method of evaluating the device prepared in each of Examples and Comparative Examples, and the results of the evaluation will be described. Table 1 collectively shows the evaluation results.

<Layer Structure>

By observing a cross-sectional SEM image of the laminate structure according to each of Examples and Comparative Examples, the position of the pyrochlore type oxide layer in the device was observed.

<Crystal Structure>

Film forming conditions of the piezoelectric films in all the Examples and Comparative Examples were the same, and it was found by X-ray diffraction that each of the piezoelectric films formed under the film forming conditions was a perovskite single layer and was preferentially oriented to a (100) plane of crystals.

<Piezoelectric Characteristics>

Figure 5A:
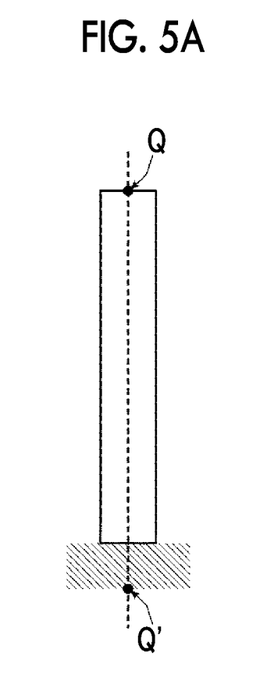
FIG. 5A is a top view showing a cantilever type device according to any one of Examples and Comparative Examples.
Figure 5B:
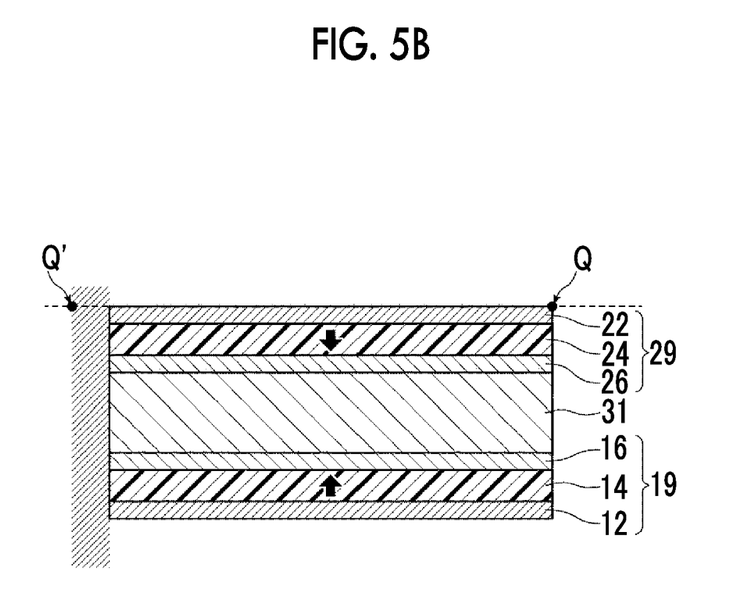
FIG. 5B is a cross-sectional view taken along line Q-Q' showing the cantilever type device of FIG. 5A.

In each of the piezoelectric portions of the cantilever type device shown in FIGS. 5A and 5B, the electrode layer 16, 26 of the vibration plate 31 side were connected to the ground potential, and a 1 kHz sine wave voltage Vpp=10 and an offset voltage of −5 V were applied to the electrode layers 12 and 22 distant from the vibration plate 31 side. The phases of the voltages applied to the piezoelectric films 14 and 24 were shifted by 180°. At this time, the vertical displacement was measured. The displacement rate of a cantilever tip end during driving was measured using a laser Doppler vibrometer (LDV), and the displacement was calculated based on the displacement rate and the driving frequency. Table 1 shows values normalized with respect to the displacement of Example 1 as 1.

In addition, in order to obtain the withstand voltage of each of the devices, the electrodes on the vibration plate side were connected to the ground potential, and a negative DC voltage was applied to the electrodes on the opposite sides while increasing the voltage at 2 V/sec. At this time, the flowing current was measured. The dielectric breakdown voltage at which the current value rapidly increased and a large leakage current was generated was set as a withstand voltage. In Examples 1 and 2 and Comparative Example 2, the withstand voltage of each of the two piezoelectric portions disposed with the vibration plate interposed therebetween was measured. The withstand voltages of the two piezoelectric portions in one element were the same.

<Durability>

In an environment of 40° C. and 80% RH, the electrodes on the vibration plate side were connected to the ground potential, and a negative voltage of 20 V was applied to the electrodes on the opposite sides. In this state, the piezoelectric element was driven for 1000 hours. After driving the piezoelectric element for 1000 hours, the displacement was measured using the same method as above-described, and a change from the displacement at the initial stage was obtained.

TABLE 1

| | Positions of Pyrochlore Layers | Driving Displacement | Withstand Voltage | Change in Driving Properties (after 1000 Hours) |
|---|---|---|---|---|
| Example 1 | Two Layers Positioned on Side Distant From Vibration Plate | 1 | 200 V or Higher | No Change |
| Example 2 | Two Layers Positioned on Side Distant From Vibration Plate | 0.95 | 200 V or Higher | No Change |
| Comparative Example 1 | Vibration Plate-Side Interfaces | 0.5 | 100 to 150 V | 3% Decrease |
| Comparative Example 2 | Two Layers Positioned on Side Distant From Vibration Plate | 1 | 100 to 150 V | 3% Decrease |

In Example 1, the pyrochlore type oxide layers were observed in the interface between the first piezoelectric film and the first electrode layer and in the interface between the second piezoelectric film and the second electrode layer, respectively. On the other hand, no pyrochlore type oxide layers were observed on the vibration substrate sides of the respective piezoelectric films, that is, in the interface between the first piezoelectric film and the first facing electrode layer and in the interface between the second piezoelectric film and the second facing electrode layer. The withstand voltages of the two sides were excellent at 200 V or higher. The driving displacement was two times that of the unimorph device according to Comparative Example 1. In addition, the properties did not deteriorate after 1000 hours.

In Example 2, the bonding was performed using the same method as in Example 1. Therefore, the pyrochlore type oxide layers were observed in the interface between the first piezoelectric film and the first electrode layer and in the interface between the second piezoelectric film and the second electrode layer, respectively. In addition, no pyrochlore type oxide layers were observed on the vibration substrate sides of the respective piezoelectric films. In addition, since the thickness of the second piezoelectric film was small, the displacement was not equivalent to that of the device according to Example 1 but was higher than that of Comparative Example 1. The withstand voltage was equivalent to that of Example 1. The initial amount of warpage was also suppressed as compared to that of Comparative Example 1.

In Comparative Examples 2, the piezoelectric films were directly formed on the opposite surfaces of the vibration plate, respectively. Therefore, pyrochlore phases having a size of about 10 nm were present in the vibration plate interfaces. The displacement was not equivalent to that of Example 1, but the withstand voltage was lower than that of Example 1. In addition, the change in durability over time was observed, and the displacement slightly deteriorated.

The above results are presumed to be as follows. The withstand voltage was low and the displacement decreased over time because the pyrochlore type oxide layers were present on the vibration plate sides. As compared to Examples 1 and 2 under conditions of the same thickness, the withstand voltage was high and deterioration over time did not occur because the pyrochlore type oxide layers were present on the sides distant from the vibration plate.

The piezoelectric element according to the present invention is applicable to various devices having a suitable structure such as an ink jet device, a high-frequency switch, a micromirror, a power generation device, a speaker, a vibrator, a pump, or an ultrasound probe.

EXPLANATION OF REFERENCES

1: piezoelectric element
2: laminate structure
10: first structure
11: first silicon substrate
11a: silicon substrate
11b: recess portion
12: first electrode layer
13: pyrochlore type oxide layer
14: first piezoelectric film
16: first facing electrode layer
19: first piezoelectric portion
20: second structure
21: second silicon substrate
22: second electrode layer
23: pyrochlore type oxide layer
24: second piezoelectric film
26: second facing electrode layer
29: second piezoelectric portion
30: vibration plate substrate
31: vibration plate
32: first adhesive layer
34: second adhesive layer

What is claimed is:

1. A laminate structure comprising:
a vibration plate having a thickness of more than 10 μm and 500 μm or less;
a first structure that is bonded to a first surface of the vibration plate; and
a second structure that is bonded to a second surface of the vibration plate,
wherein the first structure includes a first silicon substrate and includes a first electrode layer, a first piezoelectric film, and a first facing electrode layer that are sequentially laminated on one surface of the first silicon substrate,
the first facing electrode layer is disposed to face the first surface of the vibration plate and is bonded to the first surface of the vibration plate,
the second structure includes a second silicon substrate and includes a second electrode layer, a second piezoelectric film, and a second facing electrode layer that are sequentially laminated on one surface of the second silicon substrate,
the second facing electrode layer is disposed to face the second surface of the vibration plate and is bonded to the second surface of the vibration plate,
the first piezoelectric film and the second piezoelectric film are formed of a perovskite type oxide, and
pyrochlore type oxide layers having a thickness of 3 nm or more are formed in an interface between the first piezoelectric film and the first electrode layer and in an interface between the second piezoelectric film and the second electrode layer, respectively.

2. The laminate structure according to claim 1, wherein a first adhesive layer is provided between the first facing electrode layer and the vibration plate, and a second adhesive layer is provided between the second facing electrode layer and the vibration plate.

3. The laminate structure according to claim 2, wherein the first adhesive layer and the second adhesive layer are formed of an inorganic material.

4. The laminate structure according to claim 1, wherein the first piezoelectric film is formed using a sputtering method,
a spontaneous polarization vector of the first piezoelectric film is directed from the first electrode layer to the first facing electrode layer, and
a spontaneous polarization vector of the second piezoelectric film is directed from the second electrode layer to the second facing electrode layer.

5. The laminate structure according to claim 1, wherein the first facing electrode layer and the second facing electrode layer are patterned.

6. The laminate structure according to claim 1, wherein the vibration plate is formed of silicon.

7. The laminate structure according to claim 1, wherein the first structure and the second structure are symmetrical to each other with respect to the vibration plate, and
compositions of the perovskite type oxides which form the first piezoelectric film and the second piezoelectric film, respectively, are the same.

8. The laminate structure according to claim 1, wherein the perovskite type oxides are represented by the following Formula PX, $A_a(Zr_x,Ti_y,M_{b-x-y})_bO_c$ (PX), in Formula PX, A represents an A-site element which is at least one element including Pb, M represents a B-site element which is at least one element selected from the group consisting of V, Nb, Ta, and Sb, $0<x<b$, $0<y<b$, and $0 \leq b-x-y$.

9. A piezoelectric element which is obtained by removing at least a part of the first silicon substrate and the second silicon substrate from the laminate structure according to claim 1.

10. The laminate structure according to claim 1, wherein the pyrochlore type oxide layers have a thickness of 50 nm or less.

11. A piezoelectric element which is obtained by laminating a first electrode layer, a first piezoelectric film, a first facing electrode layer, a vibration plate having a thickness of more than 10 μm and 500 μm or less, a second facing electrode layer, a second piezoelectric film, and a second electrode layer in this order on one surface of a silicon substrate,
wherein the first piezoelectric film and the second piezoelectric film are formed of a perovskite type oxide, and
pyrochlore type oxide layers having a thickness of 3 nm or more are formed in an interface between the first piezoelectric film and the first electrode layer and in an interface between the second piezoelectric film and the second electrode layer, respectively.

12. The piezoelectric element according to claim 11, wherein a first adhesive layer is provided between the first facing electrode layer and the vibration plate, and
a second adhesive layer is provided between the second facing electrode layer and the vibration plate.

13. The piezoelectric element according to claim 11, wherein the pyrochlore type oxide layers have a thickness of 50 nm or less.

* * * * *